US012613462B2

(12) United States Patent
Abe et al.

(10) Patent No.: US 12,613,462 B2
(45) Date of Patent: Apr. 28, 2026

(54) RESIST PATTERN FORMING METHOD AND SEMICONDUCTOR DEVICE MANUFACTURING METHOD

(71) Applicant: KIOXIA CORPORATION, Tokyo (JP)

(72) Inventors: Satomi Abe, Nagoya Aichi (JP); Kentaro Matsunaga, Yokkaichi Mie (JP); Issui Aiba, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 1026 days.

(21) Appl. No.: 17/682,713

(22) Filed: Feb. 28, 2022

(65) Prior Publication Data

US 2023/0082514 A1    Mar. 16, 2023

(30) Foreign Application Priority Data

Sep. 15, 2021    (JP) ................................. 2021-150491

(51) Int. Cl.
*G03F 1/32*        (2012.01)
*H01L 21/027*      (2006.01)
*H10B 41/27*       (2023.01)

(52) U.S. Cl.
CPC ............ *G03F 1/32* (2013.01); *H01L 21/0275* (2013.01); *H10B 41/27* (2023.02)

(58) Field of Classification Search
CPC . G03F 1/32; G03F 7/2037; G03F 7/26; G03F 7/30
See application file for complete search history.

(56) References Cited

U.S. PATENT DOCUMENTS

| | | | | |
|---|---|---|---|---|
| 2004/0086788 A1* | 5/2004 | Shiota | ................. | G02B 5/3083 |
| | | | | 430/5 |
| 2006/0009038 A1* | 1/2006 | Cohen | ............... | H01L 21/31051 |
| | | | | 430/311 |
| 2016/0139509 A1 | 5/2016 | Hashimoto et al. | | |
| 2016/0260731 A1* | 9/2016 | Nagai | ................. | H01L 21/0273 |
| 2017/0077139 A1 | 3/2017 | Iguchi | | |
| 2019/0296080 A1 | 9/2019 | Iguchi | | |

FOREIGN PATENT DOCUMENTS

| | | |
|---|---|---|
| JP | 2007256922 A | 10/2007 |
| JP | 2011215614 A | 10/2011 |
| JP | 2012527639 A | 11/2012 |
| JP | 6478051 B2 | 3/2019 |

(Continued)

*Primary Examiner* — Daborah Chacko-Davis
(74) *Attorney, Agent, or Firm* — Kim & Stewart LLP

(57) ABSTRACT

A method of forming a resist pattern includes applying a photoresist to first and second regions of a processing target to form a resist layer. The processing target includes a stacked body of alternately stacked first and second layers. The first region includes an upper surface of the stacked body, and the second region includes a recess extending into the stacked body from the upper surface. The resist layer is then patterned with light passed through a multi-gradation mask including a partial translucent feature at an outer perimeter of the recess, a light shielding feature corresponding in position to the recess, and a translucent feature surrounding the partial translucent feature. A resist pattern is formed including an overhang portion extending above a portion of the recess.

24 Claims, 13 Drawing Sheets

(56)             References Cited

FOREIGN PATENT DOCUMENTS

| | | | |
|----|----------------|----|---------|
| JP | 2019169489 | A  | 10/2019 |
| JP | 2020154338 | A  | 9/2020  |
| JP | 2020166114 | A  | 10/2020 |
| JP | 2021043404 | A  | 3/2021  |
| WO | 2010134779 | A2 | 11/2010 |

* cited by examiner

RESIST PATTERN FORMING METHOD AND SEMICONDUCTOR DEVICE MANUFACTURING METHOD

CROSS-REFERENCE TO RELATED APPLICATION(S)

This application is based upon and claims the benefit of priority from Japanese Patent Application No. 2021-150491, filed Sep. 15, 2021, the entire contents of which are incorporated herein by reference.

FIELD

Embodiments described herein relate generally to a resist pattern forming method and a semiconductor device manufacturing method.

BACKGROUND

A semiconductor device such as a three-dimensional memory is known.

DETAILED DESCRIPTION

Figure 1:
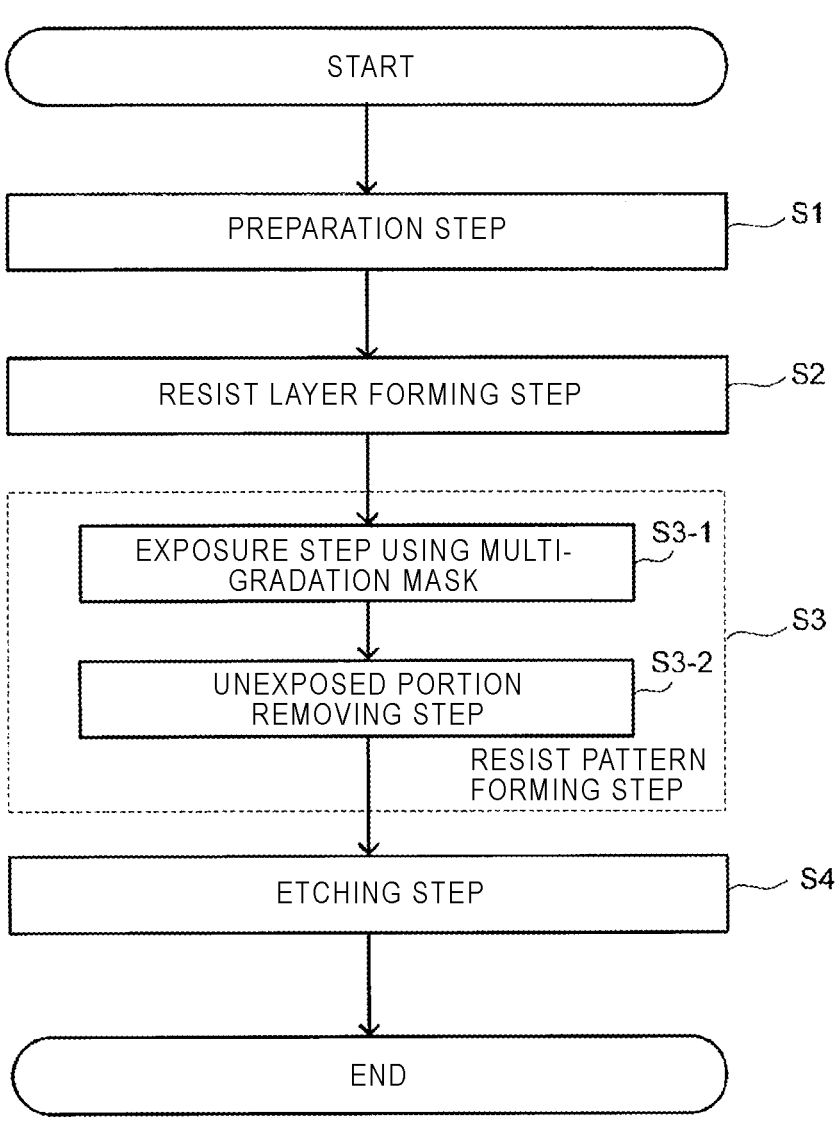
FIG. 1 is a flowchart of a method of manufacturing a semiconductor device.

Embodiments provide a method of processing a pattern of a processing target with a high accuracy.

In general, according to one embodiment, a method of forming a resist pattern includes applying a photoresist to first and second regions of a processing target to form a resist layer. The processing target has a stacked body of first and second layers alternately stacked one on the other. The first region includes an upper surface of the stacked body. The second region includes a recess extending in a first direction from the upper surface into the stacked body. The resist layer is patterned with light through a multi-gradation mask. The multi-gradation mask has a partial translucent feature corresponding in position to an outer perimeter of the recess, a light shielding feature corresponding in position to the recess, and a translucent feature surrounding the partial translucent feature. A resist pattern is formed by exposing the patterned resist layer to a developer. The resist pattern thus formed includes an overhang portion extending in a second direction parallel to the upper surface to a position above a portion of the recess in the first direction.

Hereinafter, certain example embodiment will be described with reference to drawings. In some cases, the depicted dimensional relationships of components in the drawings, such as the relationship between the thickness and the planar dimension of each element, the ratio of the thickness of each element, etc. may differ from actual ones. In the present disclosure, elements which are substantially the same as one another are denoted by the same reference numerals, and descriptions thereof may be appropriately omitted from subsequent description.

FIG. 1 is a flowchart of a method of manufacturing a semiconductor device. This manufacturing method includes a preparation step S1, a resist layer forming step S2, a resist pattern forming step S3, and an etching step S4, as illustrated in FIG. 1. The manufacturing method is not limited to the flowchart illustrated in FIG. 1. For example, the resist layer forming step S2, the resist pattern forming step S3, and the etching step S4 may be repeatedly performed one after the other.

Preparation Step S1

Figure 2:
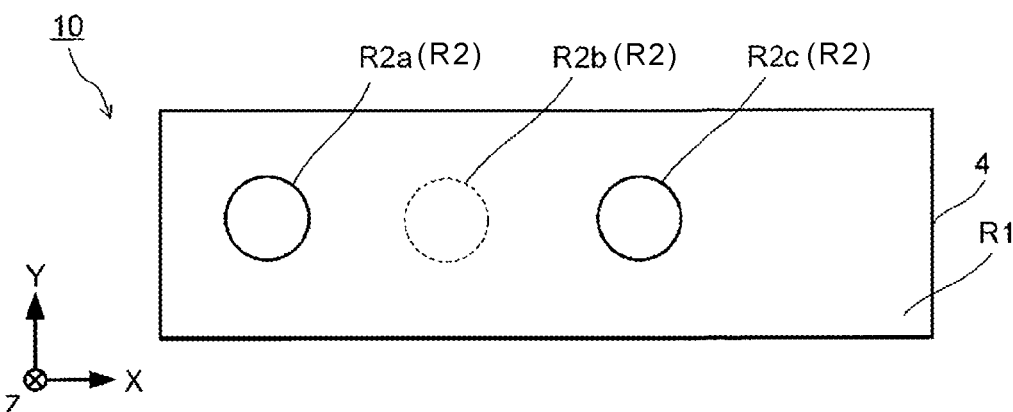
FIG. 2 is a schematic view illustrating aspects related to a preparation step.
Figure 3:
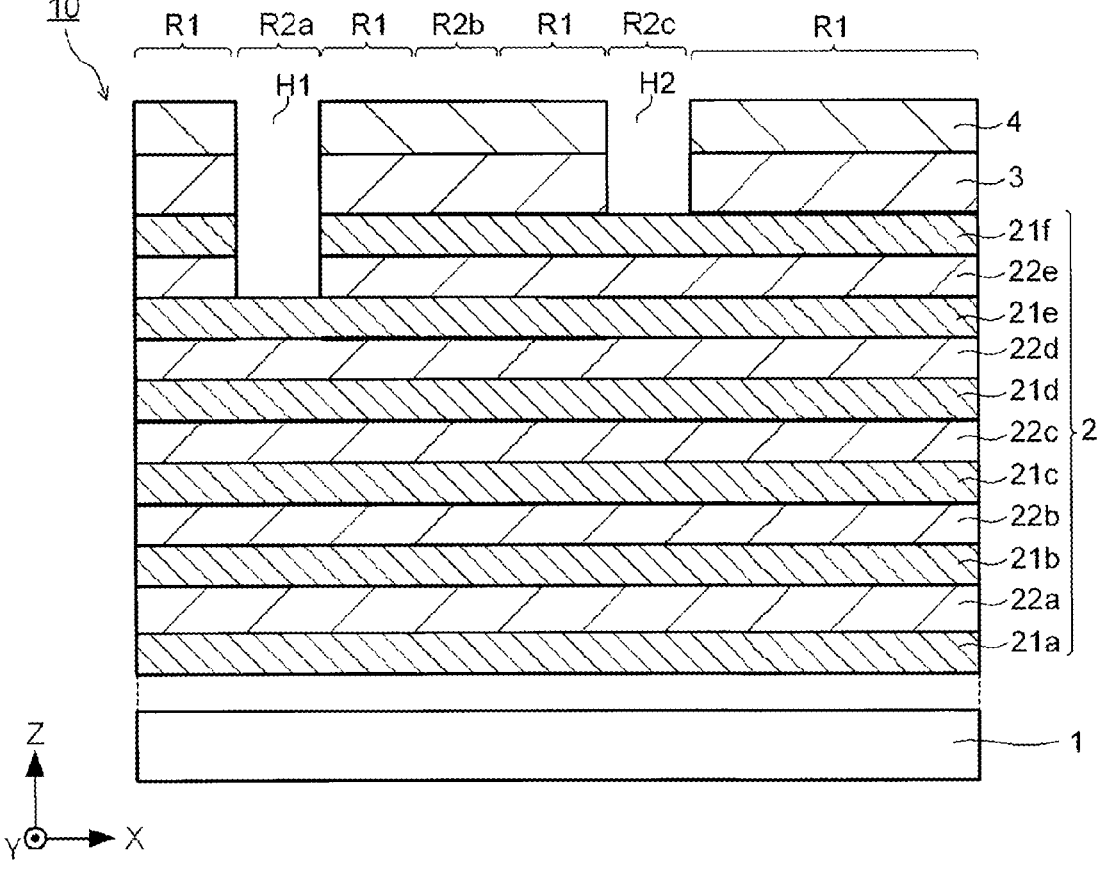
FIG. 3 is a schematic view illustrating aspects related to a preparation step.

FIG. 2 and FIG. 3 are schematic views illustrating an example of the preparation step S1. In the preparation step S1, a processing target 10 is prepared. FIG. 2 illustrates a part of the X-Y plane of the processing target 10. FIG. 3 illustrates a part of the X-Z cross-section of the processing target 10.

As an example of the processing target 10, a device wafer, or the like used in the manufacturing of a three-dimensional memory may be utilized. The processing target 10 includes a substrate 1, a stacked body 2, an interlayer insulating film 3, and a hard mask layer 4. The structure of the processing target 10 is not limited to the structure illustrated in FIG. 2 and FIG. 3.

As an example of the substrate 1, a semiconductor substrate such as a single crystal silicon substrate may be utilized. The processing target 10 may further include a base film such as an insulating film provided on the surface of the substrate 1.

The stacked body 2 is provided above the substrate 1. The stacked body 2 includes a conductive layer 21 (see FIG. 19) and an insulating layer 22 (see FIG. 19). The stacked body 2 illustrated in FIG. 3 includes a plurality of conductive layers 21 (conductive layers 21a to 21f) and a plurality of insulating layers 22 (insulating layers 22a to 22e), and each conductive layer 21 and each insulating layer 22 are alternately stacked in the Z axis direction. The number of the stacked conductive layers 21 and the stacked insulating layers 22 is not limited to the number of stacked layers illustrated in FIG. 3. In FIG. 3, a space between the substrate 1 and the stacked body 2 is indicated by dotted lines and is otherwise omitted from the depictions, but the stacked body 2 may also be formed directly on the substrate 1 in some examples.

The plurality of conductive layers 21 function as, for example, word lines of the three-dimensional memory. The conductive layer 21 comprise, for example, a metal, a metal compound, or a semiconductor material including a conductive impurity element (dopant). Examples of metal may include tungsten and the like. Examples of a metal compound include titanium nitride, tungsten nitride, and the like. Examples of a semiconductor containing a conductive impurity element include n-type polycrystalline silicon, p-type polycrystalline silicon and the like.

The insulating layer 22 comprises, for example, silicon oxide.

The interlayer insulating film 3 is provided on the stacked body 2. The interlayer insulating film 3 comprises, for example, silicon oxide. The processing target 10 does not necessarily have to include the interlayer insulating film 3.

The hard mask layer 4 is provided on the interlayer insulating film 3. The hard mask layer 4 comprises, for example, an inorganic material. Examples of an inorganic material in this context include nitrides, oxides, carbides, metals, or metal oxides or metal nitrides. The processing target 10 does not necessarily have to include the hard mask layer 4.

The upper surface of the processing target 10 includes a pattern having a region R1 and a region R2, which is surrounded by the region R1 on the X-Y plane. In the processing target 10 illustrated in FIG. 2 and FIG. 3, a plurality of regions R2 (regions R2a to R2c) are illustrated. The number of the regions R2 is not limited to the number illustrated in FIG. 2 and FIG. 3.

The region R2a has a recess H1. The recess H1 extends through the inside of the stacked body 2 in the Z axis direction and reaches the conductive layer 21e. The region R2c has a recess H2. The recess H2 extends in the Z axis direction and reaches the conductive layer 21f. The region R2b does not have any recess therein. Without limitation to the structure illustrated in FIG. 2 and FIG. 3, the processing target 10 only has to have a recess in at least one of the regions R2a to R2c. The recess H1 and the recess H2 are formed after the processing target 10 is partially etched by using, for example, a resist mask.

Resist Layer Forming Step S2

Figure 4:
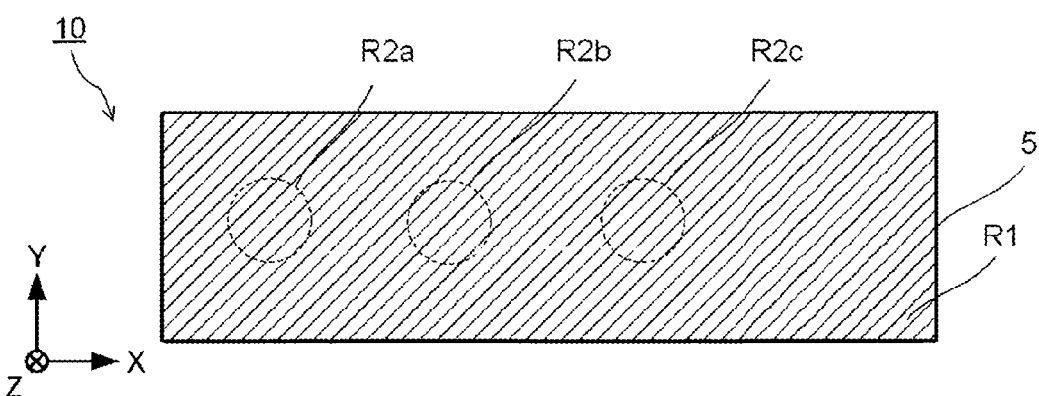
FIG. 4 is a schematic view illustrating aspects related to a resist layer forming step.
Figure 5:
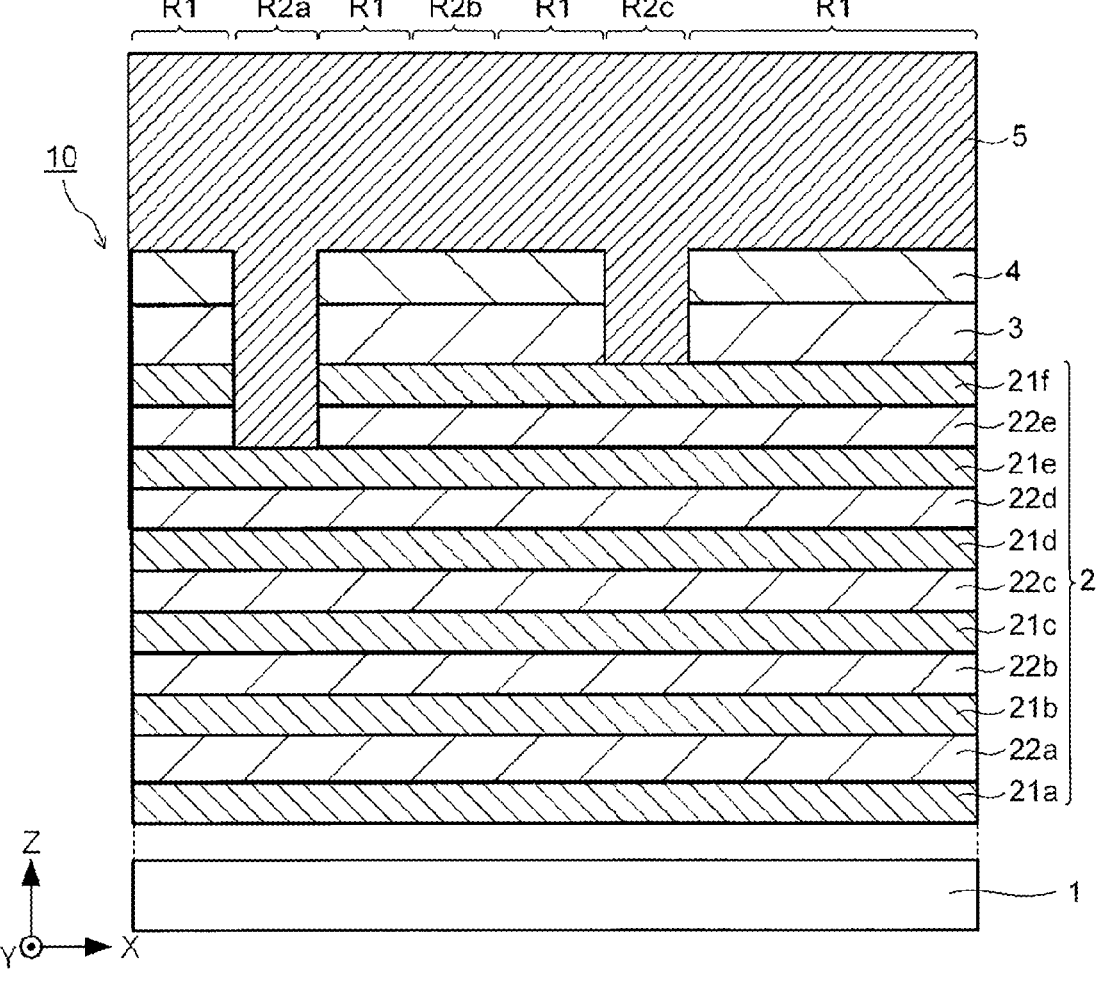
FIG. 5 is a schematic view illustrating aspects related to a resist layer forming step.

FIG. 4 and FIG. 5 are schematic views illustrating an example of the resist layer forming step S2. In the resist layer forming step S2, a resist layer 5 is formed on the processing target 10. FIG. 4 illustrates a part of the X-Y plane of the processing target 10. FIG. 5 illustrates a part of the X-Z cross-section of the processing target 10.

The resist layer 5 is formed by applying, for example, a photoresist to the region R1 and the regions R2a to R2c. The photoresist is, for example, a negative-tone photoresist. The resist layer 5 covers/fills the recess H1 and the recess H2. It is desirable that the thickness of the resist layer 5 is, for example, 300 nm to 3,000 nm.

Resist Pattern Forming Step S3

In the resist pattern forming step S3, the resist layer 5 is processed to form a resist pattern. The resist pattern forming step S3 includes an exposure step S3-1 and an unexposed portion removing step S3-2.

Figure 6:
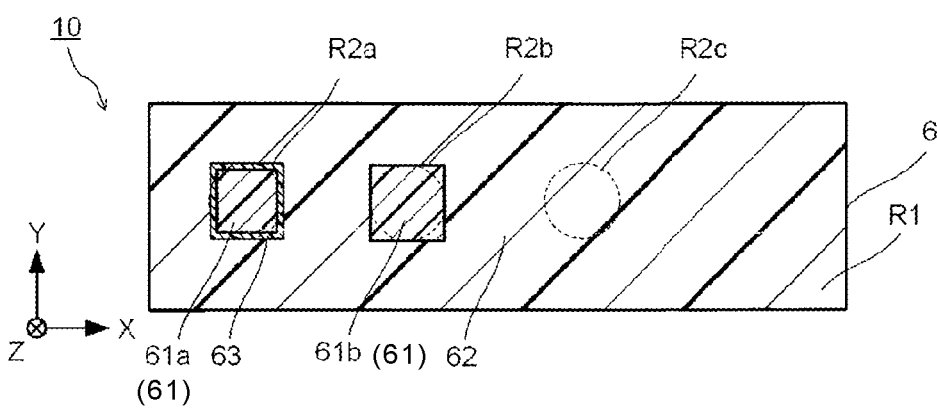
FIG. 6 is a schematic view illustrating aspects related to an exposure step.
Figure 7:
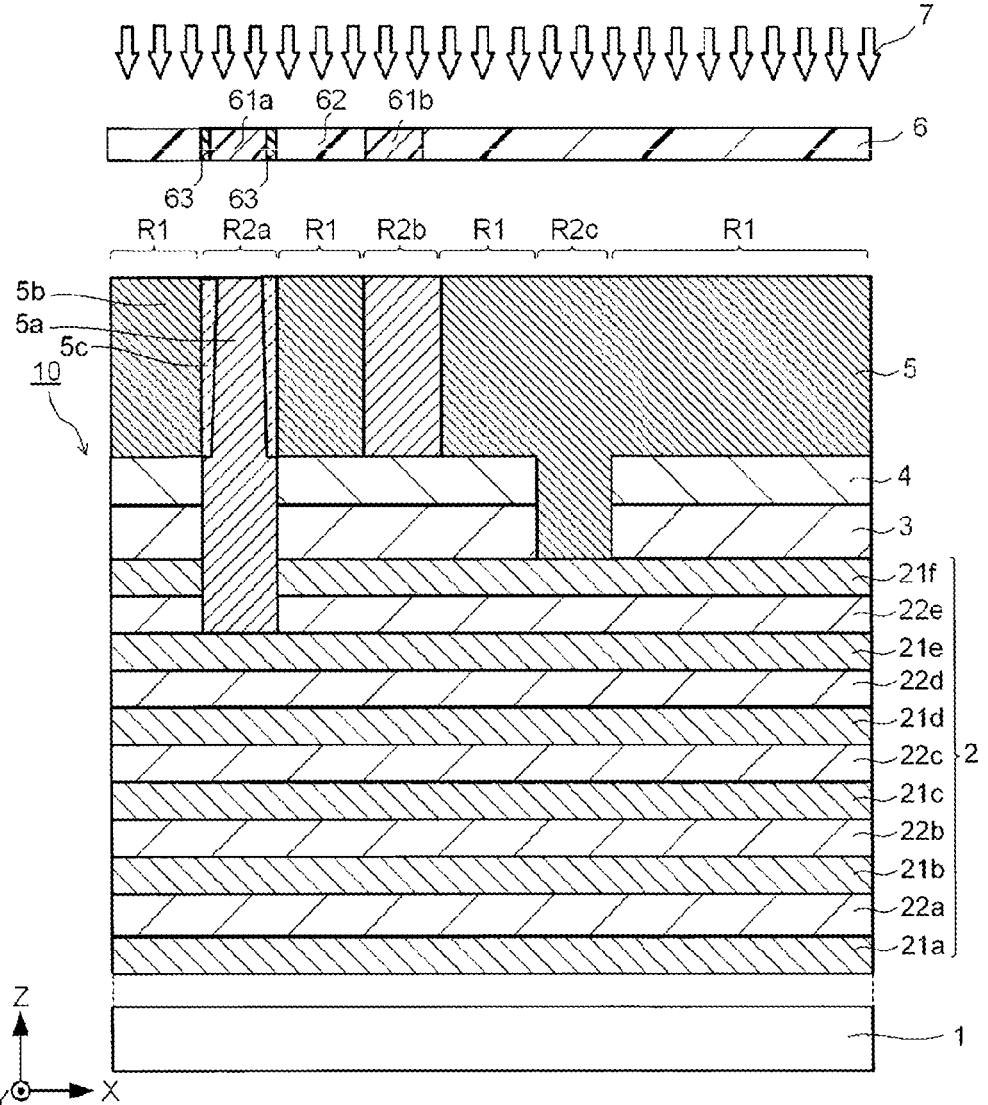
FIG. 7 is a schematic view illustrating aspects related to an exposure step.

FIG. 6 and FIG. 7 are schematic views illustrating an example of the exposure step S3-1. In the exposure step S3-1, the resist layer 5 is selectively exposed by irradiating the resist layer 5 with exposure light 7 passed through a multi-gradation mask 6. FIG. 6 illustrates a part of the X-Y plane of the processing target 10. FIG. 7 illustrates a part of the X-Z cross-section of the processing target 10.

The multi-gradation mask 6 is a photomask including a light shielding portion 61, a translucent portion 62, and a semi-translucent portion 63. Examples of the multi-gradation mask 6 may include a halftone mask and the like.

The light shielding portion 61 blocks the exposure light 7. The multi-gradation mask 6 illustrated in FIG. 6 and FIG. 7 includes a plurality of light shielding portions 61 (light shielding portions 61a and 61b). The light shielding portion 61a overlaps with the recess H1 when viewed in the Z axis direction. This also includes a case where at least a part of the light shielding portion 61a overlaps with at least a part of the recess H1 when viewed in the Z axis direction. The light shielding portion 61b overlaps with the region R2b when viewed in the Z axis direction. This also includes a case where at least a part of the light shielding portion 61b overlaps with at least a part of the region R2b when viewed in the Z axis direction.

The transmittance of the light shielding portion 61 for the exposure light 7 is, for example, 0.1% or less, preferably 0.01% or less. The material of the light shielding portion 61 is not particularly limited as long as it is a material blocking transmission of the exposure light. For example, the light shielding portion 61 can be a chromium-based material or a transition metal silicide-based material.

When the material of the light shielding portion 61 is a chromium-based material, chromium (Cr) or a chromium-based material comprising chromium (Cr) and at least one of nitrogen (N), oxygen (O), or carbon (C) may be used. Specifically, materials such as Cr, CrN, CrO, CrC, CrON, CrCN, CrCO, and CrCON may be used.

When the material of the light shielding portion 61 is a transition metal silicide-based material, a transition metal silicide, nitrides of a transition metal silicide, oxides of a transition metal silicide, carbides of a transition metal silicide, oxynitrides of a transition metal silicide, oxycarbides of a transition metal silicide, carbonitrides of a transition metal silicide, and oxynitride carbides of a transition metal silicide can be used. As for a transition metal, molybdenum (Mo), tantalum (Ta), tungsten (W), titanium (Ti), zirconium (Zr) and the like are suitable.

The translucent portion 62 overlaps with the region R1 when viewed in the Z axis direction. This also includes a case where at least a part of the translucent portion 62 overlaps with at least a part of the region R1 when viewed in the Z axis direction. The translucent portion 62 may also overlap with the region R2c. The translucent portion 62 has a first transmittance for the exposure light 7. The first transmittance is, for example, 85% or more, preferably 95% or more. The translucent portion 62 comprises a material including silicon and oxygen. Examples of such a material may include quartz glass, synthetic quartz glass, aluminosilicate glass, soda lime glass, low thermal expansion glass (such as $SiO_2$—$TiO_2$ glass), and the like.

The semi-translucent portion 63 is provided, for example, between the translucent portion 62 and the light shielding portion 61 in the X axis direction. The semi-translucent portion 63 overlaps with the region R2*a* when viewed in the Z axis direction. This also includes a case where at least a part of the semi-translucent portion 63 overlaps with at least a part of the region R2*a* when viewed in the Z axis direction.

The semi-translucent portion 63 has a second transmittance for the exposure light 7. Specifically, the semi-translucent portion 63 has a second transmittance for light that is included in the exposure light 7. For example, when a KrF laser is used as light source, the second transmittance is for a wavelength in a range of 247 nm to 249 nm. The second transmittance is lower than the first transmittance. The second transmittance is, for example, 10% to 60%, preferably 20% to 60%. The semi-translucent portion 63 may comprise a plurality of regions having different transmittances for the exposure light 7.

The semi-translucent portion 63 comprises, for example, a transition metal silicide-based material or a chromium-based material. The transition metal silicide-based material comprises a transition metal, silicon, and at least one of oxygen or nitrogen. Examples of a transition metal may include molybdenum (Mo), tantalum (Ta), tungsten (W), titanium (Ti), zirconium (Zr) and the like. The chromium-based material comprises chromium and at least one of oxygen or nitrogen. The second transmittance can be appropriately set by changing, for example, the density of semi-translucent portion 63 according to the type of the exposure light 7 or the material being used for the resist layer 5. The semi-translucent portion 63 may include at least one of oxygen or nitrogen in order to adjust the second transmittance.

Examples of the exposure light 7 may include krypton fluoride (KrF) excimer laser light and the like. When the exposure light 7 is passed through the multi-gradation mask 6, the resist layer 5 corresponding in position to the light shielding portion 61 is not exposed and an unexposed portion 5*a* is formed. The resist layer 5 corresponding in position to the translucent portion 62 is exposed and an insolubilized portion 5*b* is formed, and the resist layer 5 corresponding in position to the semi-translucent portion 63 is exposed according to the second transmittance and a semi-insolubilized portion 5*c* is formed. As a result, a resist layer having an overhang shape is formed. Here, the resist layers 5 corresponding to the light shielding portion 61, the translucent portion 62 and the semi-translucent portion 63 are resist layers located at positions overlapping with the light shielding portion 61, the translucent portion 62 and the semi-translucent portion 63 when viewed in an irradiation direction of the exposure light 7. Insolubilization in this context refers to solubility of a resist in a developer solution or the like. Thus, an insoluble or insolubilized portion of resist layer 5 can remain after the resist layer 5 is exposed to a developer while the soluble (or solubilized) portion of the resist layer 5 is removed.

Figure 8:
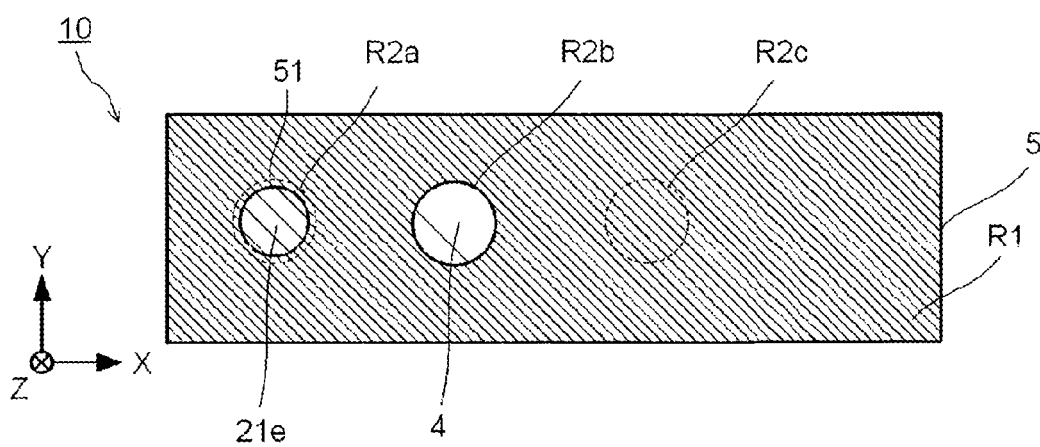
FIG. 8 is a schematic view illustrating aspects related to an unexposed portion removing step.
Figure 9:
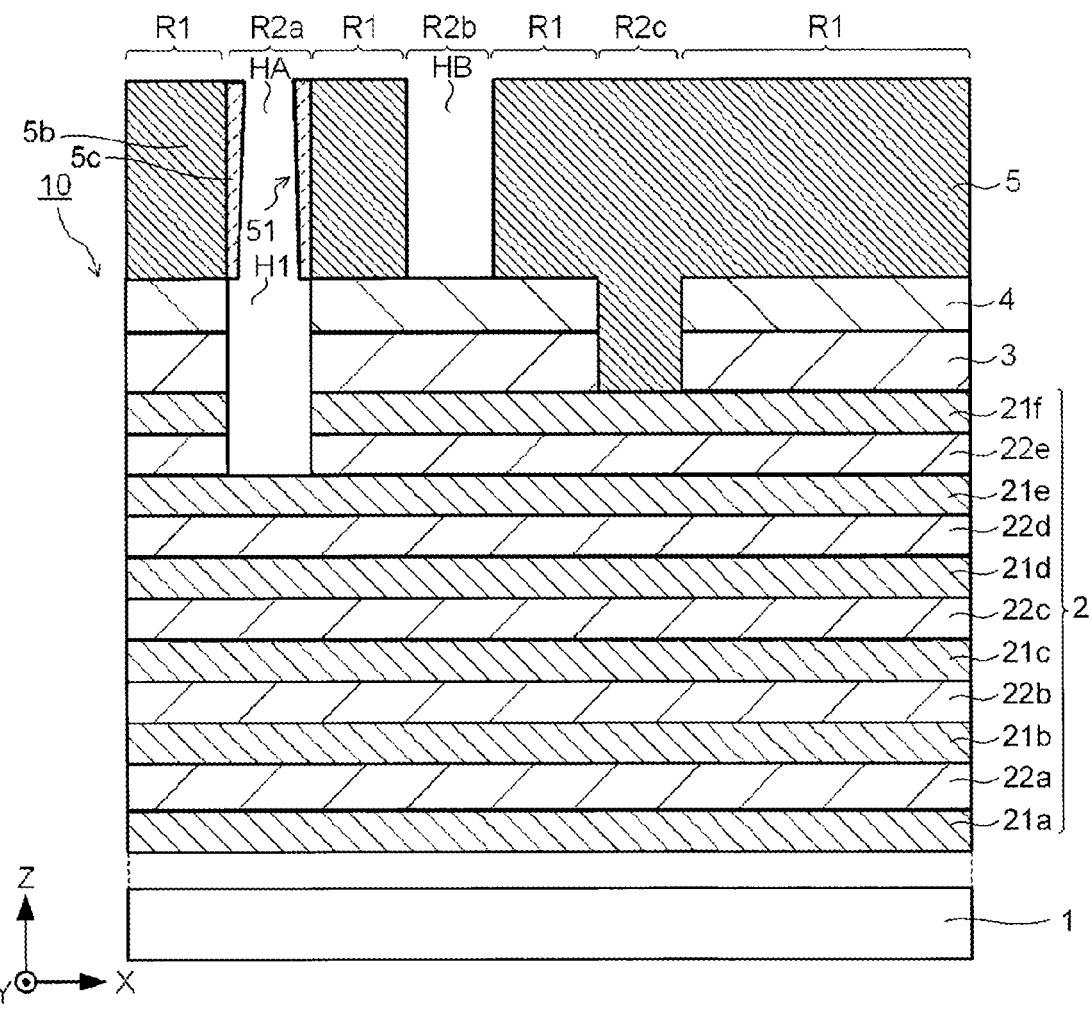
FIG. 9 is a schematic view illustrating aspects related to an unexposed portion removing step.

FIG. 8 and FIG. 9 are schematic views illustrating an example of the unexposed portion removing step S3-2. In the unexposed portion removing step S3-2, the unexposed portion 5*a* of the resist layer 5 is removed. The unexposed portion 5*a* can be removed by, for example, exposure to a developer. FIG. 8 illustrates a part of the X-Y plane of the processing target 10. FIG. 9 illustrates a part of the X-Z cross-section of the processing target 10.

In the exposure step S3-1 and the unexposed portion removing step S3-2, an opening HA is formed in the region R2*a* and an opening HB is formed in the region R2*b* when viewed in the Z axis direction. The opening HA partially overlaps with the recess H1 when viewed in the Z axis direction. Then, a resist pattern having the insolubilized portion 5*b* (first resist region) and the semi-insolubilized portion 5*c* (second resist region) is formed.

Figure 10:
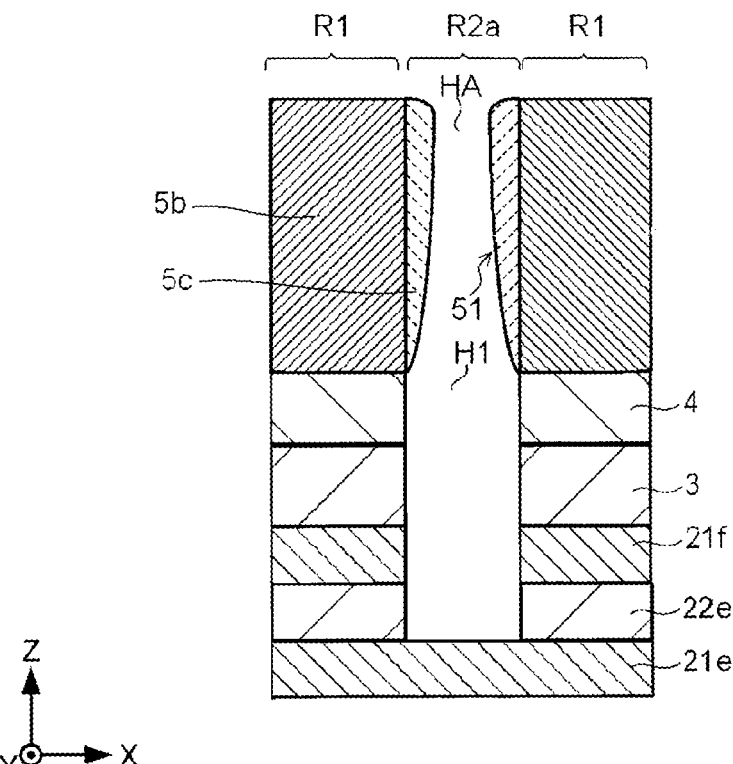
FIG. 10 is a schematic view of an overhang portion in an enlarged scale.

FIG. 10 is a schematic view of a part of the resist pattern in the resist pattern forming step S3, in an enlarged scale. The resist pattern has an overhang shape protruding from the region R1 toward the region R2*a*. The X axis direction-width of the protruding resist layer 5 at the upper end of the region R1 is larger than the X axis direction-width at the lower end of the region R1. The overhang shape is not limited to the shape illustrated in FIG. 10. It is possible to form the shape illustrated in FIG. 10 or the like by adjusting, for example, the second transmittance. For example, it is possible to form the shape by setting the transmittance of the semi-translucent portion 63 to 60% or less.

Etching Step S4

Figure 11:
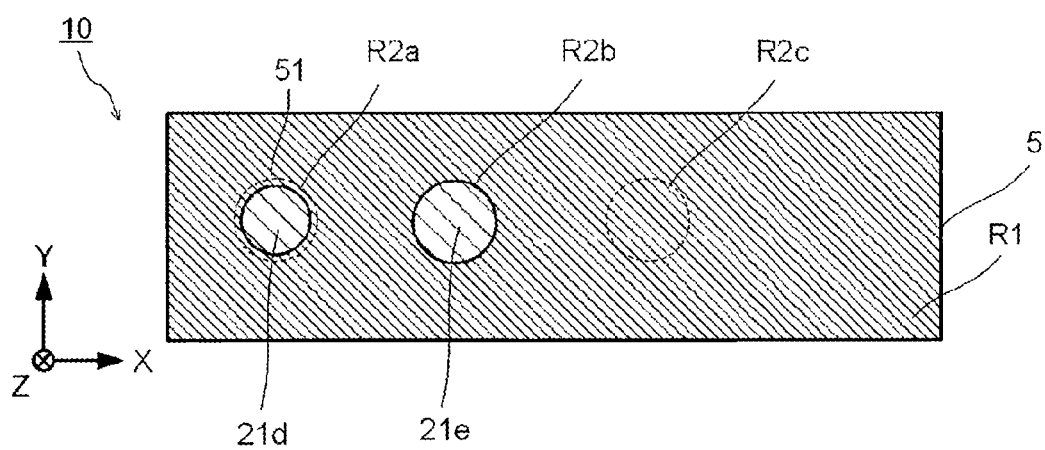
FIG. 11 is a schematic view illustrating aspects related to an etching step.
Figure 12:
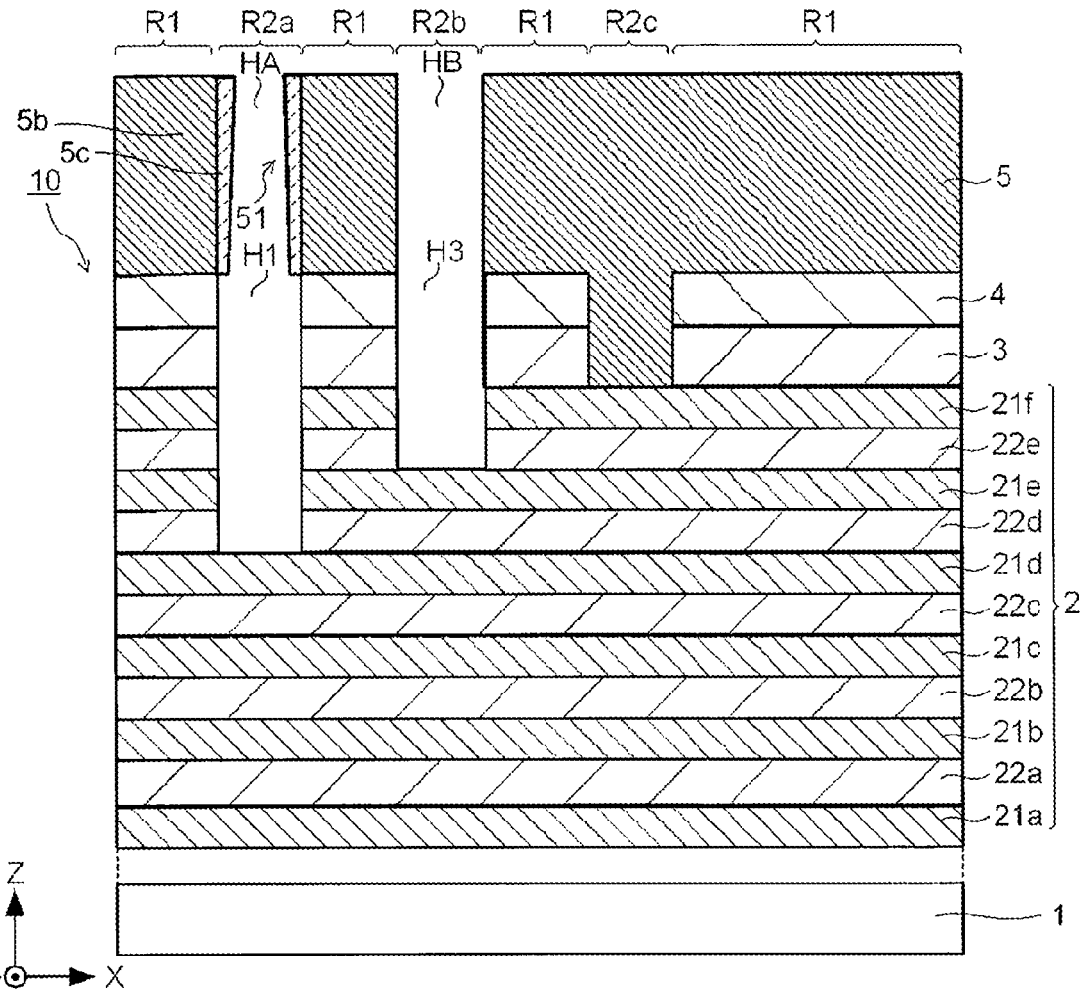
FIG. 12 is a schematic view illustrating aspects related to an etching step.

FIG. 11 and FIG. 12 are schematic views illustrating an example of the etching step S4. In the etching step S4, the processing target 10 is partially etched by using the resist layer 5 as an etch mask. The processing target 10 can be etched by using, for example, reactive ion etching (RIE). FIG. 11 illustrates a part of the X-Y plane of the processing target 10. FIG. 12 illustrates a part of the X-Z cross-section of the processing target 10.

Through the etching step S4, in the region R2*a*, the recess H1 is extended further in the Z axis direction and now reaches the conductive layer 21*d*, and in region R2*b*, a recess H3 extends in the Z axis direction and reaches the conductive layer 21*e*. The resist layer 5 can be removed after the etching step S4.

As described above, a resist pattern having an overhang portion overlapping part of a recess is formed by using a multi-gradation mask, and a processing target having a recess is etched by using the corresponding resist pattern.

Figure 13:
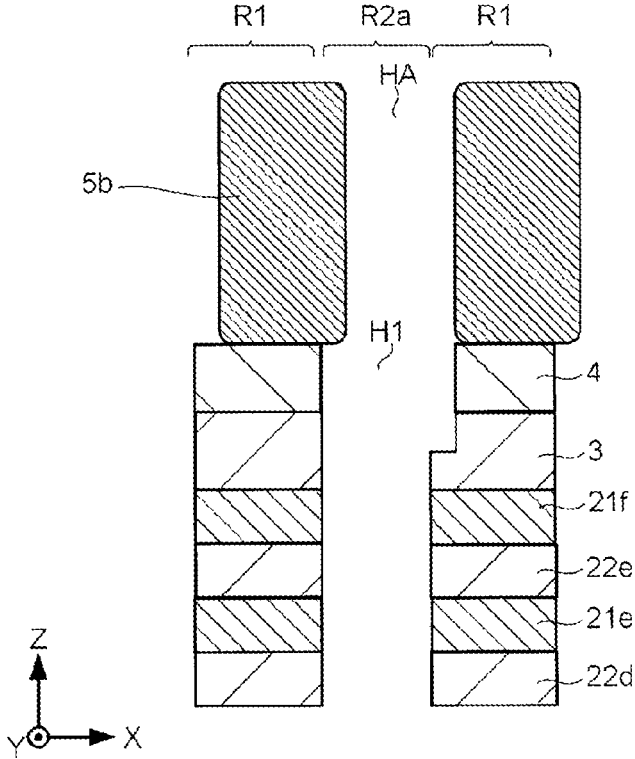
FIG. 13 is a schematic cross-sectional view illustrating a difference in recess shape according to a difference in a resist pattern shape.
Figure 14:
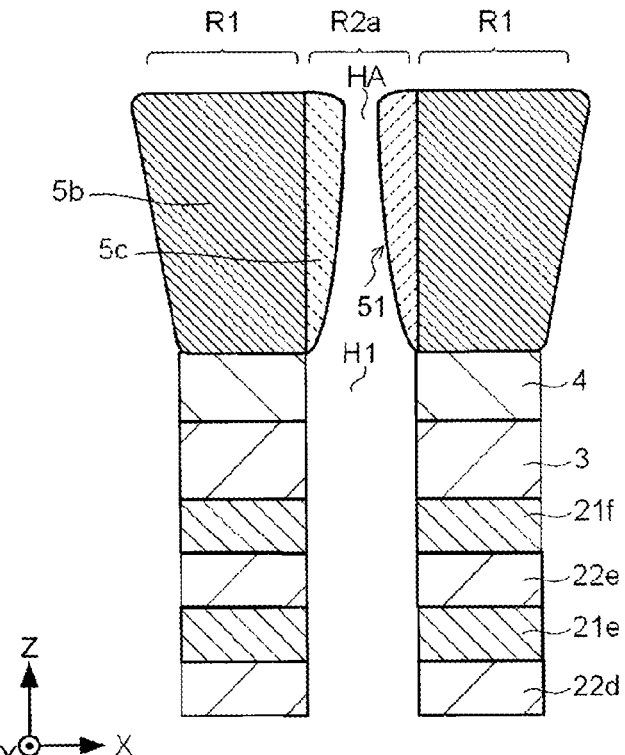
FIG. 14 is a schematic cross-sectional view illustrating a difference in recess shape according to a difference in the resist pattern shape.

FIG. 13 and FIG. 14 are schematic cross-sectional views illustrating a difference in recess shape according to a difference in the resist pattern shape.

As one example of a method of forming a recess with a high aspect ratio, a method of deeply processing a recess by using a plurality of etching steps using a plurality of different resist masks is explained. In such a method, if there is any position shift or a dimensional variation in a resist pattern at a second or subsequent etching step, then as illustrated in FIG. 13, a portion that does not need to be exposed may be exposed and processed on the surface of the processing target 10. Thus, the shape of the recess H1 after processing becomes a shape different than that of a desired/intended shape.

Inconsideration of the possibility of position shifts and/or dimensional variations of a resist pattern between different etch steps, a method of widening an area covered by a resist mask may be considered. However, in such a case, a problem may still occur in which a part of the resist mask will be present above the recess H1, and a resist remains at the bottom of the recess H1 in some cases. When the resist remains at the bottom of the recess H1, a desired hole dimension cannot be obtained. Depending on the direction of the position shift of the resist pattern or the dimensional variation amount, there may be portions having a shape different from a desired shape.

In contrast, in the example of the manufacturing method of the semiconductor device of the present embodiment, by forming an overhang portion 51, it is possible to prevent a portion that does not need to be exposed from being exposed even if there is a position shift or a dimensional variation of a resist pattern at second or subsequent etching steps, as illustrated in FIG. 14. Therefore, it is possible to process a pattern of the processing target with a high accuracy.

The example of the manufacturing method of the semiconductor device of the present embodiment is applicable when, for example, a contact hole of a contact area in a memory device such as a three-dimensional memory is being formed.

When the contact hole is formed by using KrF excimer laser light as exposure light, an expected position shift amount in a hole pattern formed by using a resist layer 5 is about 25 nm, and a dimensional variation of the hole pattern is about 35 nm. In consideration of these facts, it is desirable that the amount of the overhang (i.e., the X axis direction-width of the overhang portion 51) is 50 nm or more. By setting the amount of the overhang as 50 nm or more, it is possible to process the recess H1 with a high accuracy even if a position shift or a dimensional variation occurs in the recess H1. The upper limit of the amount of the overhang is not particularly limited but is, for example, 20% of a hole dimension under usual etch process conditions. The hole dimension is a maximum width of the contact hole.

The dimensions and parameters for the semi-translucent portion 63, which control the amount of the overhang so as to be 50 nm or more, can be calculated by using, for example, a lithography simulation. The lithography simulation can be performed by using, for example, a lithography simulation package such as S-Litho (Synopsys, Inc.).

The structure model for lithography simulation has the following conditions: a processing target is a stacked body of a silicon oxide film and a silicon nitride film on a silicon substrate, an interlayer insulating film (silicon oxide film) is on the stacked body, a hard mask layer (amorphous silicon layer) is on the interlayer insulating film, and a resist layer (negative photoresist) is on the hard mask layer. The exposure light is KrF excimer laser light (deep UV lithography). The thickness of the resist layer is 300 to 3,000 nm. The refractive index n of a multi-gradation mask is 1.7 to 1.9. The attenuation coefficient k is 0 to 0.02.

Figure 15:
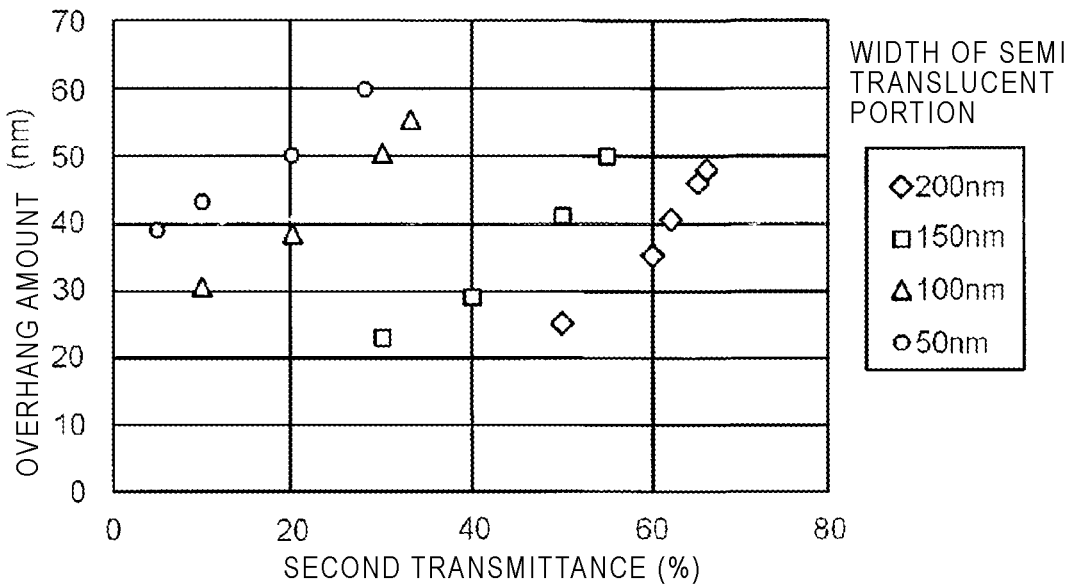
FIG. 15 is a graph illustrating the relationship between a second transmittance and an overhang amount.
Figure 16:
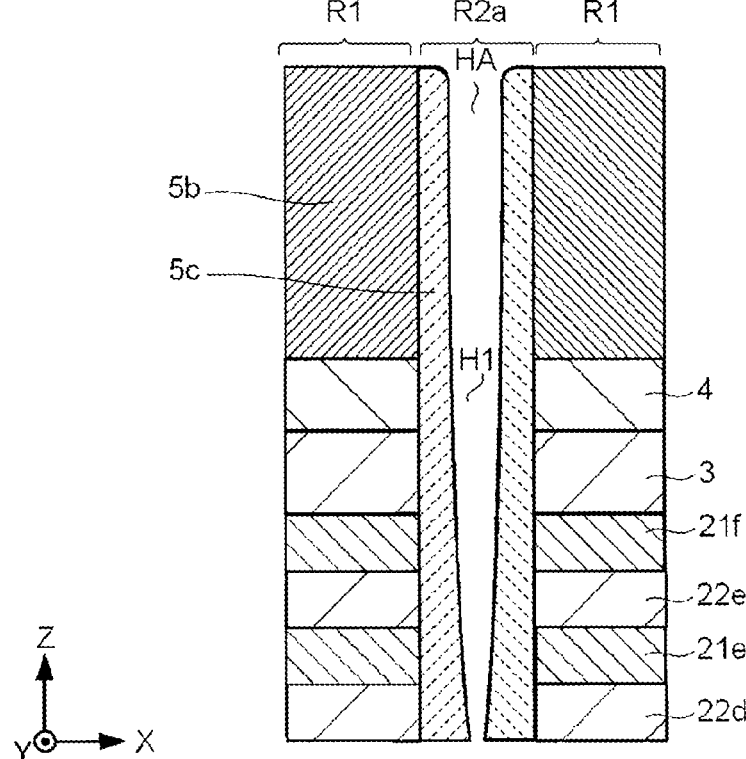
FIG. 16 is a schematic cross-sectional view illustrating a difference in a resist pattern shape according to a difference in a second transmittance.

FIG. 15 is a graph illustrating the relationship between a second transmittance and an overhang amount, which is obtained from the result of the lithography simulation. The graph illustrated in FIG. 15 illustrates results when widths (the X axis direction-widths) of a semi-translucent portion are 50 nm, 100 nm, 150 nm, and 200 nm. From FIG. 15, it can be seen that it is necessary that the X axis direction-width of the semi-translucent portion 63 of the multi-gradation mask 6 be 50 nm to 150 nm, and the transmittance (second transmittance) with respect to the exposure light be 20% or more so that the overhang amount is 50 nm or more. When the transmittance is high, as illustrated in FIG. 16, the resist may remain at the bottom of the recess H1 and affect a hole dimension. In order to prevent this effect, the transmittance needs to be 60% or less. As described above, the X axis direction-width and the second transmittance of the semi-translucent portion 63 are established based on at least one of an expected position shift amount for a resist patterning process and an expected dimensional variation amount for the resist patterning process.

When a contact hole is formed by using i-line ultraviolet light as exposure light, it is desirable that the amount of the overhang (the X axis direction-width of the overhang portion 51) is 120 nm or more. By setting the amount of the overhang as 120 nm or more, it is possible to process the recess H1 with a high accuracy even if a position shift or a dimensional variation occurs in the lithography patterning associated with the recess H1. The upper limit of the amount of the overhang is not necessarily limited but is, for example, 20% of a hole dimension under normal etch conditions.

IF i-line UV is being used as the exposure light, preferred specifications of the semi-translucent portion 63 can be calculated from a lithography simulation in the same manner as in a case where the exposure light is KrF excimer laser light. The structure model of a processing target has a stacked body of a silicon oxide film and a silicon nitride film on a silicon substrate, an interlayer insulating film (silicon oxide film) on the stacked body, a hard mask layer (amorphous silicon layer) on the interlayer insulating film, and a resist layer (negative photoresist) on the hard mask layer. The exposure light is i-line (365 nm). The thickness of the resist layer is 1,000 to 5,000 nm. The refractive index n of a multi-gradation mask is 1.5 to 1.8. The attenuation coefficient k is 0 to 0.04.

The X axis direction-width of the semi-translucent portion 63 of the multi-gradation mask 6 is set as 1,000 nm or more, preferably 5,000 nm or less, and the transmittance (second transmittance) for the exposure light is set as 35% or more so that the overhang amount is 120 nm or more. The transmittance needs to be 55% or less in order to prevent the resist from remaining at the bottom of the recess H1 and affecting a hole dimension.

Although the above examples use a negative resist as the resist layer 5, it is also possible to use a positive resist in a similar manner for different mask patterns.

Configuration Example of Memory Device

Figure 17:
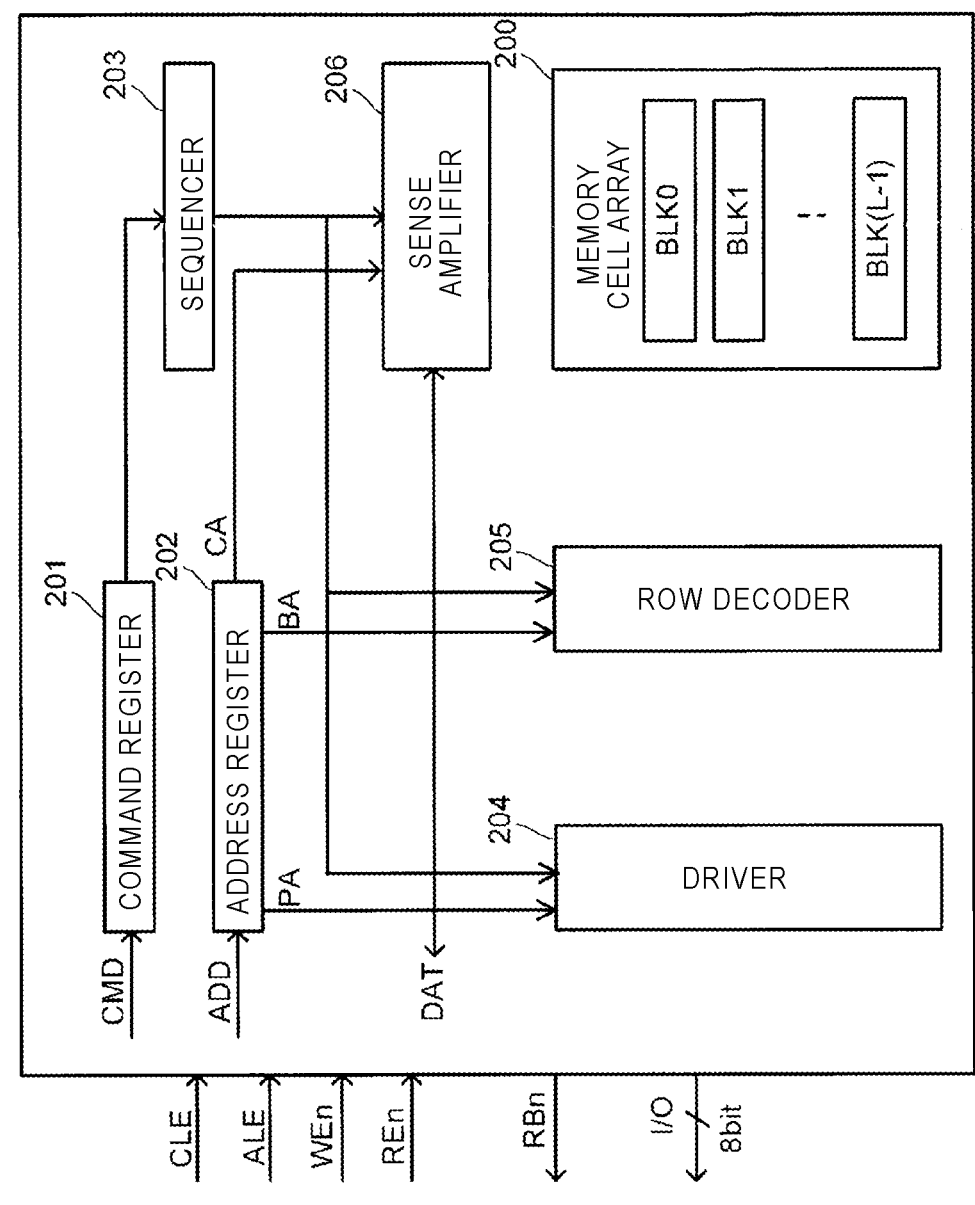
FIG. 17 is a block diagram of a memory device.

FIG. 17 is a block diagram illustrating a configuration example of a memory device. The memory device includes a memory cell array 200, a command register 201, an address register 202, a sequencer 203, a driver 204, a row decoder 205, and a sense amplifier 206.

The memory cell array 200 includes a plurality of blocks BLK (BLK0 to BLK(L-1) (where L is a natural number of 2 or more)). The block BLK is a set including a plurality of memory transistors MT storing data in a non-volatile manner.

The memory cell array 200 is connected to a plurality of word lines WL and a plurality of bit lines BL. Each memory transistor MT is connected to one of the word lines WL and one of the bit lines BL.

The command register 201 stores a command signal CMD received from a memory controller. The command signal CMD includes command data that causes, for example, the sequencer 203 to execute a read operation, a write operation, or an erase operation.

The address register 202 stores an address signal ADD received from the memory controller. The address signal ADD includes, for example, a block address BA, a page address PA, and a column address CA. For example, the block address BA, the page address PA, and the column address CA are used in selecting a block BLK, a word line WL, and a bit line BL, respectively.

The sequencer 203 controls an operation of the memory. The sequencer 203 controls the driver 204, the row decoder 205, the sense amplifier 206 and the like on the basis of, for example, the command signal CMD stored in the command register 201 so as to execute operations such as a read operation, a write operation, and an erase operation.

The driver 204 generates voltages used in the read operation, the write operation, the erase operation and the like. The driver 204 includes, for example, a DA converter. Then, the driver 204 applies the generated voltage to a signal line corresponding to a selected word line WL, on the basis of, for example, the page address PA stored in the address register 202.

The row decoder 205 selects one corresponding block BLK in the memory cell array 200 on the basis of the block address BA stored in the address register 202. Then, the row decoder 205 transmits, for example, the voltage applied to the signal line corresponding to the selected word line WL, to the selected word line WL in the selected block BLK.

During the write operation, the sense amplifier 206 applies a desired voltage to each bit line BL according to write data DAT received from the memory controller. In the read operation, the sense amplifier 206 identifies data stored in the memory cell on the basis of the voltage of the bit line BL, and then reads the determination result and transmits the determination result as data DAT to the memory controller.

Communication between the memory and the memory controller supports, for example, a NAND interface standard. For example, the communication between the memory and the memory controller uses a command latch enable signal CLE, an address latch enable signal ALE, a write enable signal WEn, a read enable signal REn, a ready busy signal RBn, and an input/output signal I/O.

The command latch enable signal CLE indicates that the input/output signal I/O received by the memory is a command signal CMD. The address latch enable signal ALE indicates that the received signal I/O is an address signal ADD. The write enable signal WEn is a signal that instructs the memory to input the input/output signal I/O. The read enable signal REn is a signal that instructs the memory to output the input/output signal I/O.

The ready busy signal RBn is a signal that notifies the memory controller of whether the memory is in a ready state for accepting an instruction from the memory controller or a busy state for not accepting the instruction.

The input/output signal I/O is, for example, an 8 bit-width signal, and may include signals such as a command signal CMD, an address signal ADD, and a write data signal DAT.

The memory and the memory controller described above may form a semiconductor memory device through a combination thereof. An example of such a semiconductor memory device includes, for example, a memory card such as an SD card, or a solid-state drive (SSD).

Figure 18:
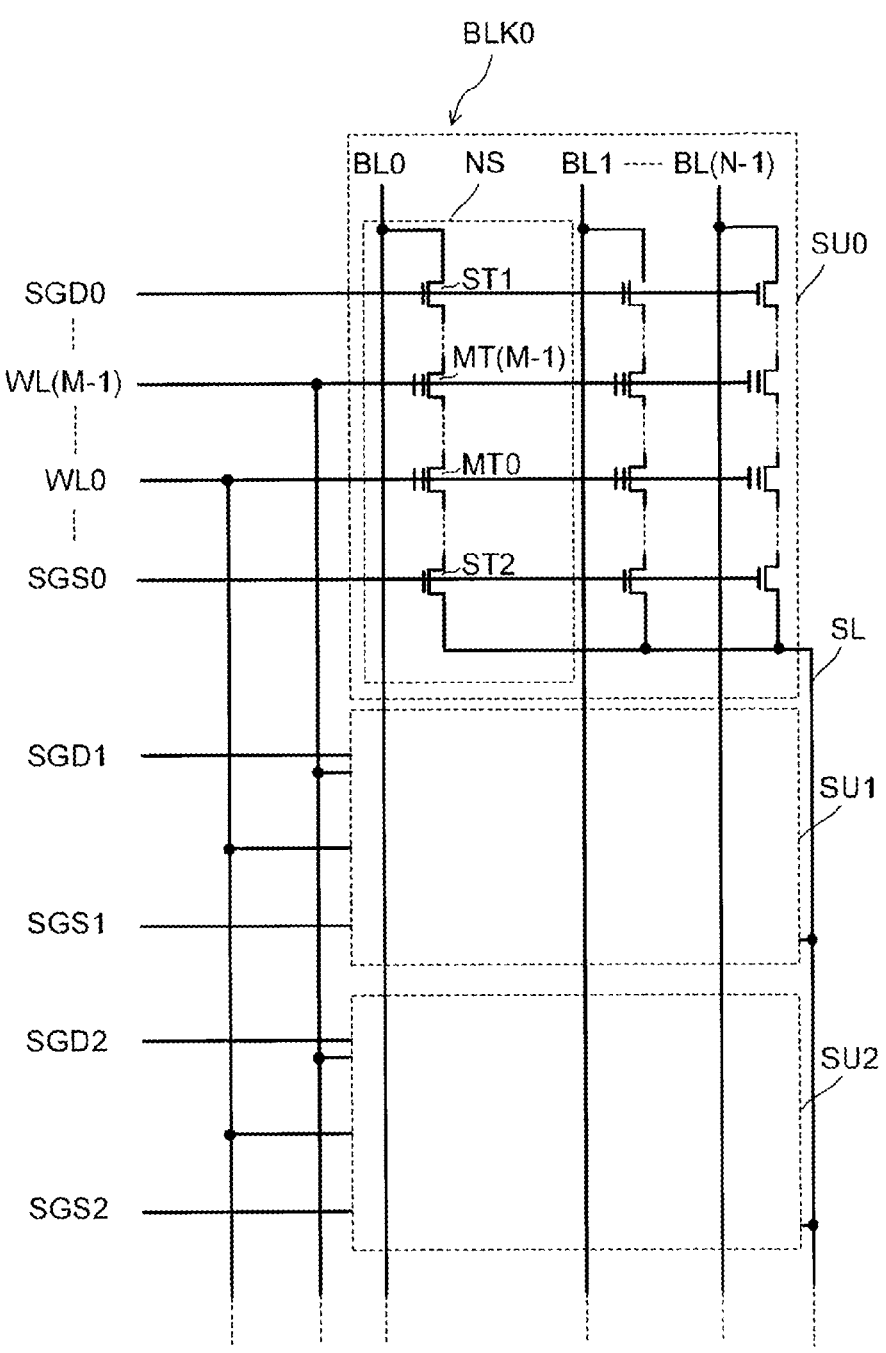
FIG. 18 is a circuit diagram of a memory cell array.

Next, a circuit configuration example of the memory cell array 200 will be described. FIG. 18 is a circuit diagram illustrating a circuit configuration of the memory cell array 200. FIG. 18 illustrates the block BLK0, but configurations of other blocks are also the same.

Each block includes a plurality of string units. Each string unit includes a plurality of NAND strings NS. FIG. 18 illustrates three string units (SU0 to SU2), but the number of string units is not particularly limited.

Each NAND string NS is connected to one of the bit lines (BL0 to BL(N-1) (where N is a natural number of 2 or more)). Each NAND string NS includes memory transistors, a select transistor ST1, and a select transistor ST2.

The memory transistors includes a control gate, and a charge storage layer, and stores data in a non-volatile manner. FIG. 18 illustrates a plurality of memory transistors (MT0 to MT(M-1) (where M is a natural number of 2 or more)), but the number of memory transistors is not particularly limited. Each NAND string NS may include a dummy memory transistor that is not used for storing data.

Each memory transistor may be a MONOS type in which an insulating film is used for a charge storage layer or may be an FG type in which a conductor layer is used for a charge storage layer. The MONOS type will be described as an example.

The select transistor ST1 is used for selecting the particular string units during various operations. The number of select transistors ST1 is not particularly limited.

The select transistor ST2 is used for selecting the particular string units during various operations. The number of select transistors ST2 is not particularly limited.

In each NAND string NS, a drain of the select transistor ST1 is connected to the corresponding bit line. A source of the select transistor ST1 is connected to one end of the memory transistors connected in series. The other end of the memory transistors connected in series is connected to a drain of the select transistor ST2.

In the same block, sources of the select transistors ST2 are connected to a common source line SL. In each string unit, gates of the select transistors ST1 are connected to each corresponding select gate line SGD. The control gates of the memory transistors are connected to corresponding word lines, respectively. Gates of the select transistors ST2 are connected to a corresponding select gate line SGS.

A plurality of NAND strings NS to which the same column address CA is assigned is connected to the same bit line BL across the different blocks. The source line SL is connected across the blocks.

Figure 19:
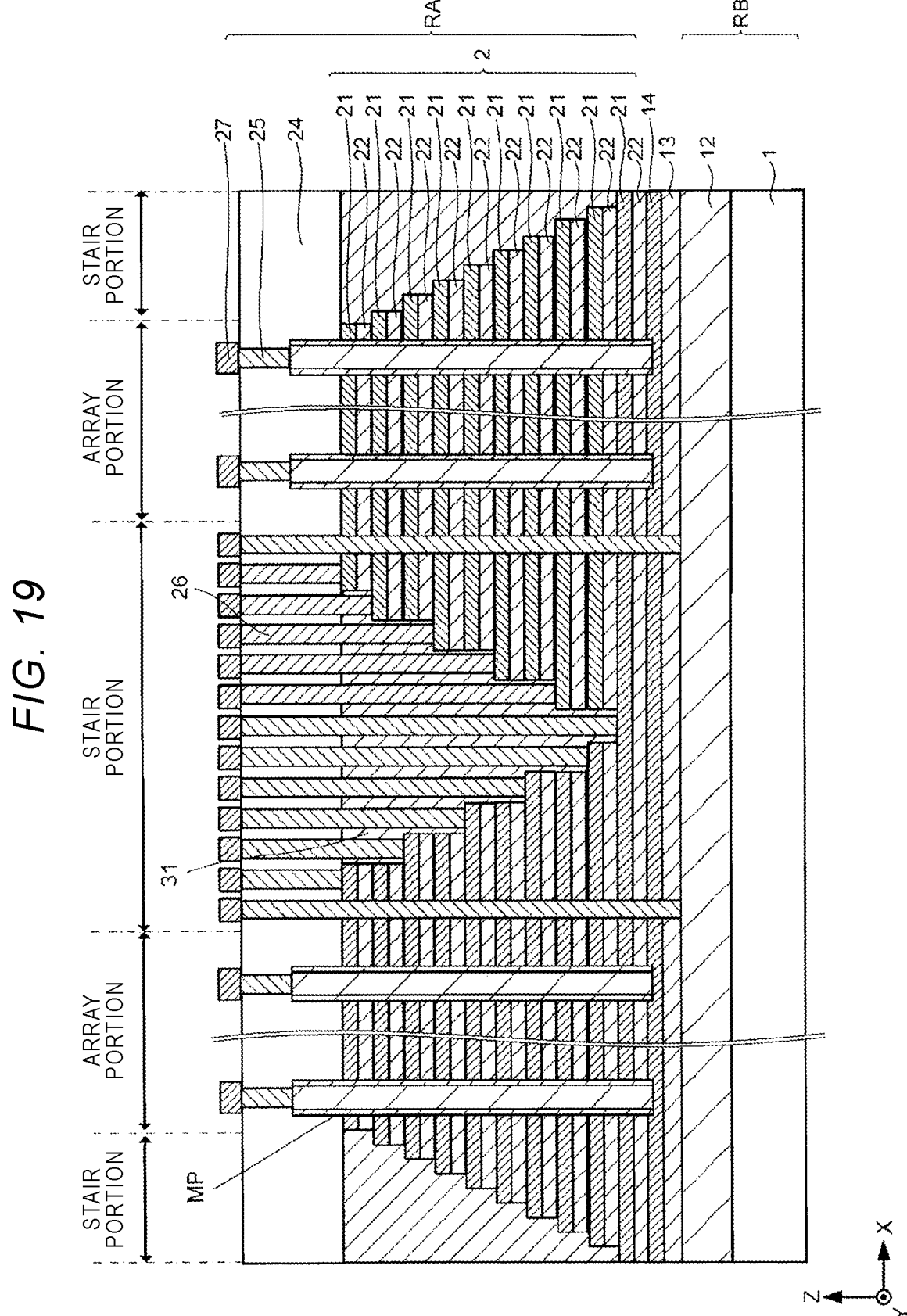
FIG. 19 is a schematic cross-sectional view illustrating a structure example of a memory device.

FIG. 19 is a schematic cross-sectional view illustrating a structure example of a memory device.

The memory device illustrated in FIG. 19 has a first region RA including the memory cell array 200 illustrated in FIG. 17, and a second region RB below the memory cell array 200. The second region RB includes, on the substrate 1, a peripheral circuit region 12 including peripheral circuits illustrated in FIG. 17 such as the command register 201, the address register 202, the sequencer 203, the driver 204, the row decoder 205, and the sense amplifier 206. Without limitation to these, the peripheral circuit region 12 may be juxtaposed with the memory cell array 200.

FIG. 19 also illustrates an insulating layer 13, a wiring layer 14, the stacked body 2 of the conductive layer 21 and the insulating layer 22, an insulating layer 24, a contact layer 25, a contact layer 26, a wiring layer 27, an insulating layer 31, and a memory pillar MP.

The insulating layer 13 is provided on the peripheral circuit region 12. The insulating layer 13 comprises, for example, silicon oxide.

The wiring layer 14 is provided on the insulating layer 13, and includes the source line SL. The wiring layer 14 comprises, for example, a metal material.

Figure 20:
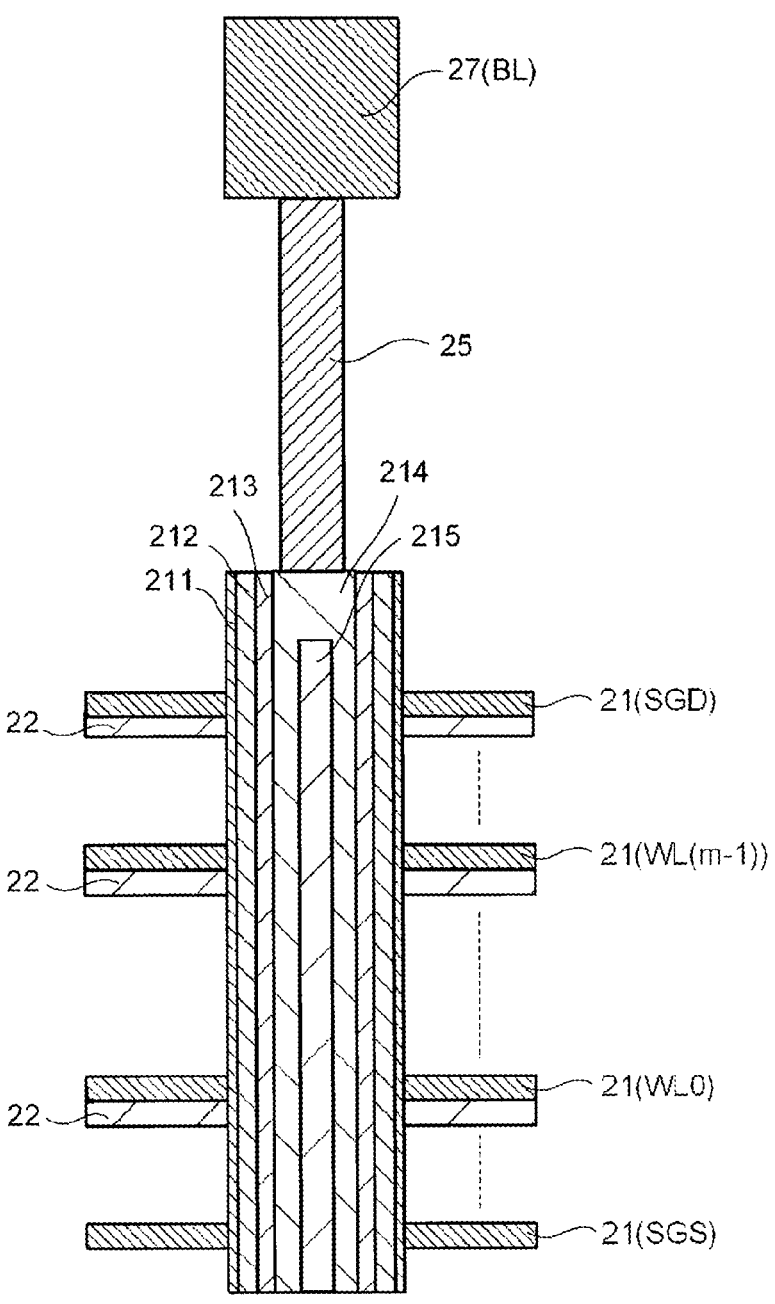
FIG. 20 is a schematic cross-sectional view of a memory pillar.
Figure 20:
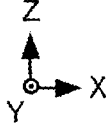

FIG. 20 is a schematic cross-sectional view illustrating a structure example of the memory pillar MP. FIG. 20 illustrates the conductive layers 21, the insulating layers 22, a block insulating film 211, a charge storage film 212, a tunnel insulating film 213, a semiconductor layer 214, a core insulating layer 215, the contact layer 25, and the wiring layer 27.

The conductive layers 21 and the insulating layers 22 are alternately stacked, forming the stacked body 2. The plurality of conductive layers 21 include a select gate line SGS, word lines WL0 to WL(m-1), and a select gate line SGD. The insulating layers 22 comprise, for example, silicon oxide. The memory pillar MP extends through the select gate line SGS, the plurality of word lines WL, and the select gate line SGD.

The block insulating film 211, the charge storage film 212, the tunnel insulating film 213, the semiconductor layer 214, and the core insulating layer 215 form a memory pillar MP. Each memory pillar MP extends along the Z axis direction. Each memory pillar MP corresponds to one NAND string NS. The block insulating film 211, the charge storage film 212, and the tunnel insulating film 213 form a memory layer between the conductive layers 21 and the insulating layers 22 and the semiconductor layer 214.

The block insulating film 211, the tunnel insulating film 213, and the core insulating layer 215 comprise, for example, silicon oxide. The charge storage film 212 comprises, for example, silicon nitride. The semiconductor layer 214 comprises, for example, polysilicon.

More specifically, a hole corresponding to the memory pillar MP is formed through the plurality of conductive layers 21. The block insulating film 211, the charge storage film 212, and the tunnel insulating film 213 are sequentially formed on the side surface of the resulting hole. Then, the semiconductor layer 214 is formed such that the side surface thereof is in contact with the tunnel insulating film 213.

The semiconductor layer 214 is connected to the wiring layer 14 through the stacked body 2 of the conductive layers 21 and the insulating layers 22 along the Z axis direction. The semiconductor layer 214 has a channel forming region of the select transistor ST1, the select transistor ST2, and the memory transistors MT. Therefore, the semiconductor layer 214 functions as a signal line connecting current paths of the select transistor ST1, the select transistor ST2, and the memory transistors MT.

The core insulating layer 215 is provided inside the semiconductor layer 214. The core insulating layer 215 extends along the semiconductor layer 214.

The contact layer 25 includes a contact plug in contact with the semiconductor layer 214. The wiring layer 27 includes the bit line BL connected to the semiconductor layer 214 via the contact plug. The wiring layer 27 comprises a metal material.

The memory pillar MP and a conductive layer 21 constituting a word line forms a memory transistor. The memory pillar MP and a conductive layer 21 constituting a select gate line SGD forms a select transistor ST1. The memory pillar MP and a conductive layer 21 constituting a select gate line SGS forms a select transistor ST2.

The memory cell array illustrated in FIG. 19 has a plurality of array portions, and a plurality of stair portions, and one of the stair portions is provided between two array portions.

The stair portion comprises the stacked body 2, the insulating layer 31, and a plurality of contact layers 26 electrically connected to the plurality of conductive layers 21. The insulating layer 24 and the insulating layer 31 correspond to, for example, the interlayer insulating film 3. The formation of the contact layers 26 is performed after the insulating layer 31 is formed in the stacked body 2 having the stair portion. For example, after a replacement step, a plurality of openings (contact holes) are formed in the insulating layer 31 and the corresponding openings are filled with a conductive material so that the contact layers 26 are formed.

These contact holes are formed by repeating the resist layer forming step S2, the resist pattern forming step S3, and the etching step S4 illustrated in FIG. 1 using the above-described manufacturing method of a semiconductor device.

By using the manufacturing method of an embodiment, it is possible to form the plurality of contact holes having different depths but with a high accuracy.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of forming a resist pattern, the method comprising:

applying a photoresist to first and second regions of a processing target to form a resist layer, the processing target including a stacked body of first and second layers alternately stacked one on the other, the first region including an upper surface of the stacked body and the second region including a recess extending in a first direction from the upper surface into the stacked body, the resist layer including a portion inside the recess;

exposing the resist layer with light through a multi-gradation mask, the multi-gradation mask including a partial translucent feature corresponding in position to an outer perimeter of the recess, a light shielding feature corresponding in position to the recess, and a translucent feature surrounding the partial translucent feature; and forming a resist pattern by developing the exposed resist layer with a developer, the resist pattern including an overhang portion extending in a second direction parallel to the upper surface to a position above a portion of the recess in the first direction, the portion of the resist layer inside the recess being removed in the developing of the exposed the resist layer with the developer.

2. The method according to claim 1, wherein the partial translucent feature transmits between 10% and 60% of an exposure light used for exposing the resist layer.

3. The method according to claim 1, wherein a width in the second direction of the partial translucent feature is set based on an expected position shift amount for the resist pattern.

4. The method according to claim 1, wherein a width in the second direction of the partial translucent feature is set based on an expected dimensional variation of features on the multi-gradation mask.

5. The method according to claim 1, wherein an exposure light for exposing the resist layer is a krypton-fluorine excimer laser.

6. The method according to claim 5, wherein the partial translucent feature transmits between 20% and 60% of the exposure light.

7. The method according to claim 1, wherein an exposure light for exposing the resist layer is i-line ultraviolet light.

8. The method according to claim 7, wherein the partial translucent feature transmits between 35% and 55% of the exposure light.

9. The method according to claim 1, wherein the multi-gradation mask is a halftone mask.

10. The method according to claim 1, wherein the partial translucent feature is between 50 nm and 150 nm in width along the second direction.

11. The method according to claim 1, wherein the overhang portion and the recess overlap in plan view.

12. The method according to claim 1, wherein the resist pattern further includes a second recess on the upper surface of the stacked body.

13. A method of manufacturing a semiconductor device, the method comprising:

applying a photoresist to first and second regions of a processing target to form a resist layer, the processing target including a stacked body of first and second layers alternately stacked one on the other, the first region including an upper surface of the stacked body and the second region including a recess extending in a first direction from the upper surface into the stacked body, the resist layer including a portion inside the recess;

exposing the resist layer with light through a multi-gradation mask, the multi-gradation mask including a partial translucent feature corresponding in position to an outer perimeter of the recess, a light shielding feature corresponding in position to the recess, and a translucent feature surrounding the partial translucent feature; and forming a resist pattern by developing the exposed resist layer with a developer, the resist pattern including an overhang portion extending in a second direction parallel to the upper surface to a position above a portion of the recess in the first direction, the portion of the resist layer inside the recess being removed in the developing of the exposed resist layer with developer; and etching the processing target by using the resist pattern as an etch mask.

14. The method according to claim 13, wherein the etching extends the recess further into the stacked body in the first direction.

15. The method according to claim 14, wherein the partial translucent feature transmits between 10% and 60% of an exposure light used for exposing the resist layer.

16. The method according to claim 13, further comprising:

forming a memory pillar structure in the stacked body.

17. The method according to claim 13, wherein the first region includes a second recess in the stacked body, and the depth of the second recess in the first direction is less than the depth of the recess after the etching of the processing target using the resist pattern as the etch mask.

18. The method according to claim 13, wherein an exposure light for exposing the resist layer is a krypton-fluorine excimer laser.

19. The method according to claim 18, wherein the partial translucent feature transmits between 20% and 60% of the exposure light.

20. The method according to claim 13, wherein an exposure light for exposing the resist layer is i-line ultraviolet light.

21. The method according to claim 20, wherein the partial translucent feature transmits between 35% and 55% of the exposure light.

22. The method according to claim 13, wherein the partial translucent feature is between 50 nm and 150 nm in width along the second direction.

23. The method according to claim 13, wherein the overhang portion and the recess overlap in plan view.

24. The method according to claim 13, wherein the resist pattern further includes a second recess on the upper surface of the stacked body.

* * * * *